United States Patent [19]

Furui et al.

[11] Patent Number: 5,406,127

[45] Date of Patent: Apr. 11, 1995

[54] PASSENGER PROTECTING APPARATUS

[75] Inventors: Takashi Furui; Kouichi Harada, both of Hyogo, Japan

[73] Assignee: Mitsubishi Denki Kabushiki Kaisha, Tokyo, Japan

[21] Appl. No.: 893,547

[22] Filed: Jun. 4, 1992

[30] Foreign Application Priority Data

Jun. 10, 1991 [JP] Japan .................................. 3-137459

[51] Int. Cl.$^6$ ............................................. B60R 21/16
[52] U.S. Cl. .................................... 307/10.1; 307/121;
280/735; 340/438; 364/424.05
[58] Field of Search ....................... 307/9.1, 10.1, 121;
340/436–438; 180/274, 281, 282, 286; 280/735;
364/424.03, 424.05

[56] References Cited

U.S. PATENT DOCUMENTS

| | | | |
|---|---|---|---|
| 4,862,091 | 8/1989 | Hillebrand | 324/415 |
| 4,950,914 | 8/1990 | Kurihara et al. | |
| 5,038,134 | 8/1991 | Kondo et al. | 340/438 |
| 5,045,835 | 9/1991 | Masegi et al. | 307/10.1 X |
| 5,134,306 | 7/1992 | Schumacher et al. | 307/10.1 |
| 5,155,376 | 10/1992 | Okano | 307/10.1 |
| 5,181,011 | 1/1993 | Okano | 340/438 |
| 5,204,547 | 4/1993 | Schumacher et al. | 307/10.1 |
| 5,331,211 | 7/1994 | Kondo et al. | 307/10.1 |

FOREIGN PATENT DOCUMENTS

| | | |
|---|---|---|
| 0453255 | 10/1991 | European Pat. Off. |
| 63-07755 | 8/1988 | Japan . |
| 63-241467 | 10/1988 | Japan . |
| 1-102372 | 4/1989 | Japan . |

WO8909147 10/1989 WIPO .

Primary Examiner—A. D. Pellinen
Assistant Examiner—Fritz M. Fleming

[57] ABSTRACT

A passenger protecting apparatus has a parallel connection of two current paths; a dummy firing current path having a dummy load and a first switch connected in series, and a firing current path having a driving device and at least one impact-sensitive switch as a second switch connected in series. A third switch in series with the aforementioned parallel circuit is closed when the third switch receives a signal indicative of an impact from a signal processing circuit. The impact-sensitive switch, mounted on the vehicle body, is closed when an impact greater than a predetermined value is exerted to the vehicle. When the vehicle has an impact exerted thereto, a diagnostic circuit directs the signal indicative of the impact to the third switch, which closes to allow the firing current to flow through the firing current path. The firing current causes the driving device to activate the passenger-protecting element. When diagnosing the third switch, the diagnosis circuit causes the first switch to close and outputs a signal indicative of an impact to the third switch through the signal processing circuit. A dummy firing current flows in the dummy firing current path through the third switch. The dummy load has a resistance substantially equal to that of the driving device, allowing the diagnostic circuit to monitor the voltage across the third switch to check the switch operation of the third switch with a dummy firing current substantially equal to the actual firing current.

32 Claims, 5 Drawing Sheets

COLLECTOR CURRENT 5,406,127

PASSENGER PROTECTING APPARATUS

BACKGROUND OF THE INVENTION

1. Field of the Invention

The present invention relates to a passenger protecting apparatus such as air bag or seat belt pretensioner which detects the collision of a vehicle, and more particularly to the diagnosis of the passenger protecting apparatus.

2. Prior Art

FIG. 6 shows a prior art air bag actuating apparatus, one type of passenger protecting apparatus disclosed in Japanese Patent Preliminary Publication No. 1-102372. In FIG. 6, an on-vehicle battery 1 supplies power to various circuits. An impact switch 2 is a mechanical switch whose contacts are opened and closed by shocks exerted on the vehicle. A squib 3 is an electric resistor that serves as a heater to ignite an air bag. Parallel-connected firing transistors 4 and 40 are inserted in series with the squib 3. The transistors 4 and 40 operate as firing switches which are switched on and off by a control signal supplied thereto.

Monitor resistors 21, 22, and 23 detects the cut off and short-circuit of the firing current path, the resistor 21 being connected in parallel with the impact switch 2, the resistor 22 with the firing transistor 4, and the resistor 23 with the firing transistor 40. A piezoelectric acceleration sensor 24 and has electrodes 24a-24d. An amplifier 25 amplifies the output of the acceleration sensor 24. A first and a second calculating circuit perform calculations based on the output of the amplifier 25 to determine whether the vehicle collided or not. A first and a second drive circuit are connected with the outputs of the first and second calculation circuits 26 and 27 and output the control signals for turning the transistors 4 and 40 on and off. A diagnosis circuit 30 is connected with the output of the amplifier 25 and performs diagnostic operation to determine whether the acceleration sensor 24 is malfunctioning. A pulse generating circuit 31 is connected with the diagnosis circuit 30 and outputs pulses for diagnosis to the electrodes 24b and 24d of the acceleration sensor 24. An alarm lamp 12 comes on if the acceleration sensor 24 is not troubled and does not come on if troubled.

The operation of the prior art apparatus will now be described below. The acceleration sensor outputs a voltage proportional to the deceleration through the electrodes 24a and 24c when the vehicle is decelerated. The voltage is amplified by the amplifier 25 and is then directed to the first and second calculation circuits 26 and 27.

When the deceleration of the vehicle is less than a predetermined value, the output of the amplifier 25 is small and therefore the first and second calculation circuits outputs no signal. The transistors 4 and 40 remain turned off so that the squib 3 generates no heat. Thus, the air bag is not actuated.

When the vehicle collides and the deceleration thereof exceeds a predetermined value, the output of the amplifier 25 is also large causing the first and second calculation circuits to output signals. The signals from the calculation circuits cause the first and second drive circuits 28 and 29 to turn on the transistors 4 and 40. At this time, the impact switch 2 is also closed due to the excessive impact. Thus, the squib 3 is energized to generate heat so that powder is exploded to instantly inflate the air bag, thereby holding the passenger at the passenger seat to protect the passenger.

The pulse generator 31 outputs diagnosis pulses when performing diagnostic operation to determine whether the acceleration sensor 24 functions normally. The diagnosis pulses are supplied to the electrodes 24b and 24d of the sensor 2. If the acceleration sensor 24 is operating normally, the piezoelectric elements operates on the diagnosis pulses and voltage in accordance with the diagnosis pulses appearing across the electrodes 24a and 24c. The voltage is then amplified by the amplifier 25 and is then supplied to the diagnosis circuit 30. The diagnosis circuit 30 makes a check to determine whether the voltage across the electrodes 24a and 24c falls within a predetermined range. If the voltage is within the determined range, the diagnosis circuit 30 causes the alarm lamp 12 to glow indicating that the acceleration sensor 24 is normal.

When the acceleration sensor 24 is in an abnormal condition, either the acceleration sensor 24 outputs no signal or the voltage is not within the predetermined range. The alarm lamp 12 will not glow.

With the aforementioned prior art, the diagnosis operation is carried out only for the sensor. The circuits such as the signal processing circuit and the firing switch elements are not checked at all.

SUMMARY OF THE INVENTION

An object of the invention is to provide a passenger protection apparatus having firing current path and/or signal processing circuit which process signals from the acceleration sensor.

In a preferred embodiment, a passenger protecting apparatus has a parallel connection of two current paths; a dummy firing current path having a dummy load and a first switch connected in series, and a firing current path having a driving device and at least one impact-sensitive switch as a second switch connected in series. A third switch in series with the aforementioned parallel circuit is closed when the third switch receives a signal indicative of an impact from a signal processing circuit. The impact-sensitive switch, mounted on the vehicle body, is closed when an impact greater than a predetermined value is exerted on the vehicle. When the vehicle has an impact exerted thereto, a diagnostic circuit directs the signal indicative of the impact to the third switch, which closes to allow the firing current to flow through the firing current path. The firing current causes the driving device to activate the passenger-protecting element. When diagnosing the third switch, the diagnosis circuit causes the first switch to close and outputs a signal indicative of an impact to the third switch through the signal processing circuit. A dummy firing current flows in the dummy firing current path through the third switch. The dummy load has a resistance substantially equal to that of the driving device, allowing the diagnostic circuit to monitor the voltage across the third switch to check the switch operation of the third switch with a dummy firing current substantially equal to the actual firing current.

BRIEF DESCRIPTION OF THE DRAWINGS

Features and other objects of the invention will be more apparent from the description of the preferred embodiments with reference to the accompanying drawings in which.

DETAILED DESCRIPTION OF THE PREFERRED EMBODIMENTS

Construction

Figure 1:
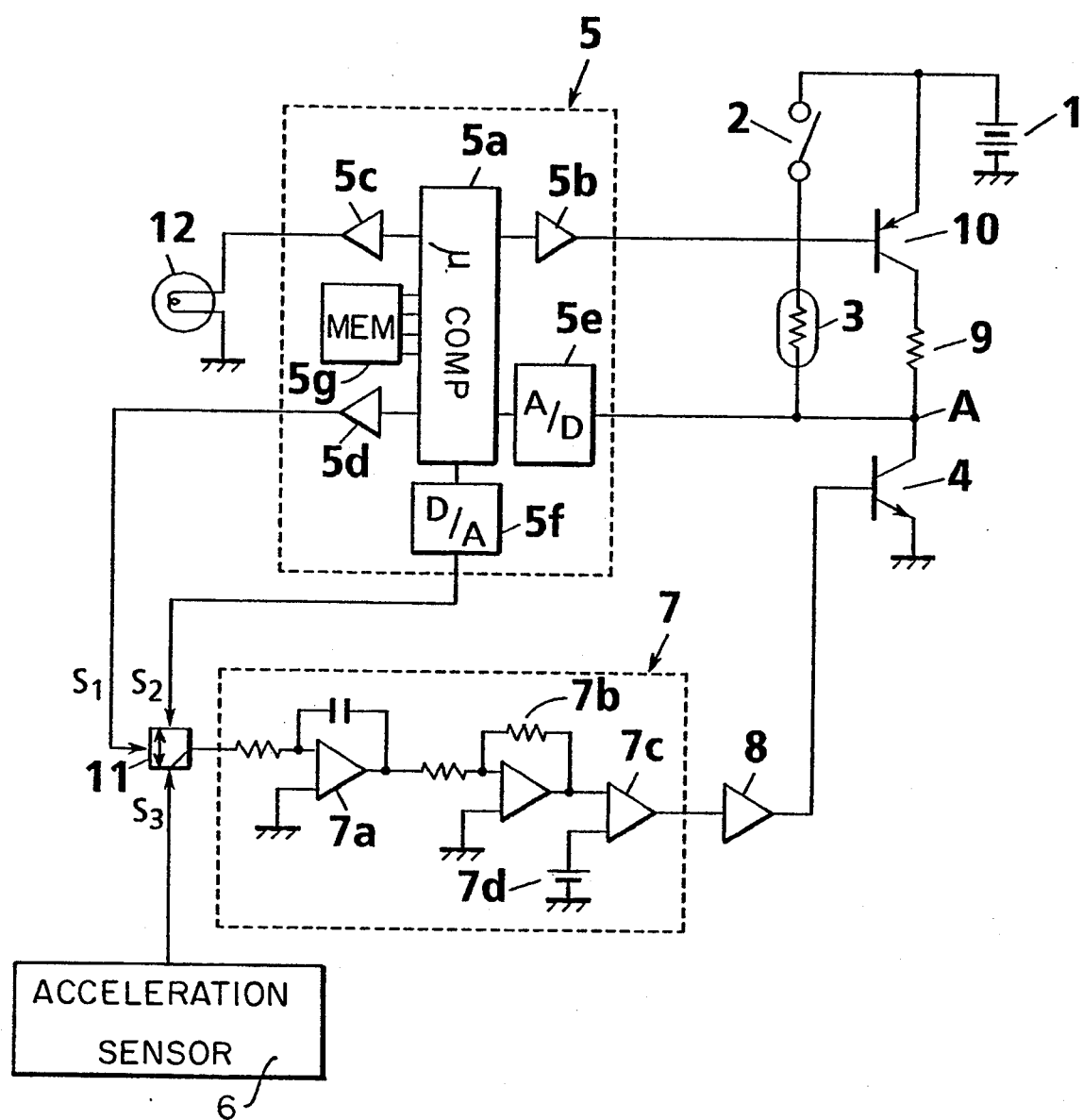
FIG. 1 shows a first embodiment of an air bag actuating apparatus as a passenger protecting apparatus according to the present invention.

Embodiments of the invention will now be described with reference to the drawings. FIG. 1 shows an air bag actuating apparatus, which is a first embodiment of a passenger protecting apparatus according to the present invention. In FIG. 1, a diagnosis circuit 5 performs the self diagnostic operation of the air bag actuating apparatus. Under control of a program stored in an external memory 5g, a microcomputer 5a performs all the necessary signal processing to control the diagnosis operation. When diagnosing a firing transistor 4, the microcomputer 5a outputs an impact-simulating signal S2 through a D/A converter 5f to a multiplexer 11. The microcomputer 5a also outputs a signal for driving a transistor switch 10 to close during diagnostic operation. The microcomputer 5a reads the voltage at the collector of a firing transistor 4 via an A/D converter 5e to detect the change in collector voltage of the transistor 4.

The multiplexer 11 receives an impact signal S3 from of an acceleration sensor 6 and the impact-simulating signal from the D/A converter 5f. The acceleration sensor 6 outputs the impact signal S3 in the form of a voltage indicative of the magnitude of the deceleration of the vehicle. The impact-simulating signal S2 has substantially the same magnitude as the impact signal S3. The multiplexer 11 selectively directs the signals S2 and S3 to a signal processing circuit 7 in accordance with a control signal S1 supplied via the buffer 5d from the microcomputer 5a. The signal processing circuit 7 makes a decision based on the output of the acceleration sensor 6 to determine whether the vehicle has collided or not.

An integrator 7a integrates the input thereto and directs the integrated signal to an amplifier 7b which in turn amplifies the input thereto to an appropriate level. The output of amplifier 7b is supplied to a comparator 7c which compares the input with a reference voltage 7d. A buffer 8 converts the output of the signal processing circuit 7 into a firing signal capable of driving the firing transistor 4.

An on-vehicle battery 1 provides a supply voltage to various circuits in the air bag firing apparatus. An impact switch 2 is a mechanical switch whose contacts are opened and closed by shocks or impacts exerted on the vehicle. A plurality of impact switches 2 may be used to detect impacts exerted to various parts of the vehicle. FIG. 1 shows only one impact switch for simplicity. A squib 3 is an electric resistor that serves as a driving device which fires to inflate an air bag. The firing transistor 4 is driven into conduction by the firing signal from the buffer 8. The elements 1 to 4 are connected in series to form a closed loop, that is, a firing current path. A dummy load 9 has an electrical resistance substantially equal to the squib 3, and is connected in series with a transistor 10. The transistor 10, resistor 9, and transistor 4 are connected in series with the battery 1 to form a closed loop i.e., a dummy firing current path. The transistor 10 has a base connected with the buffer 5b, and opens and closes the dummy firing current path in synchronism with the control signal S1. It should be noted that the firing transistor 4 is shared by both the firing current path and the dummy firing current path.

The circuit 5 outputs a signal via buffer 5c so as to drive an alarm 12 to glow when the diagnosis circuit 5 detects the failure of either the signal processing circuit 7 or the firing current path, i.e., when the diagnosis circuit 5 fails to receive the right value of voltage across the transistor 4.

Figure 5:
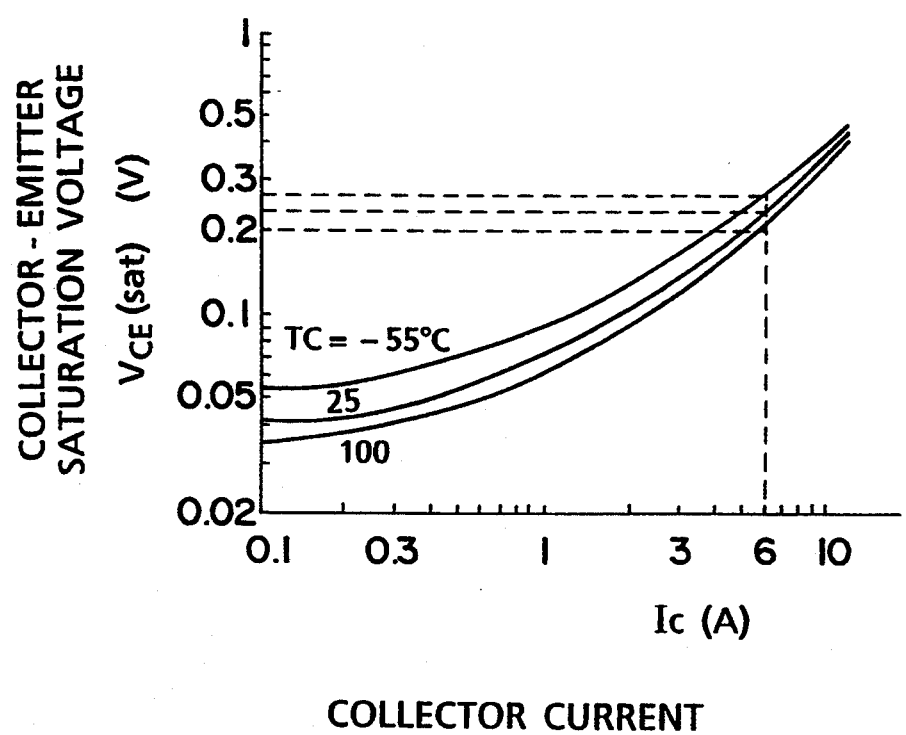
FIG. 5 shows typical collector-emitter saturation voltage characteristics of transistors.
Figure 6:
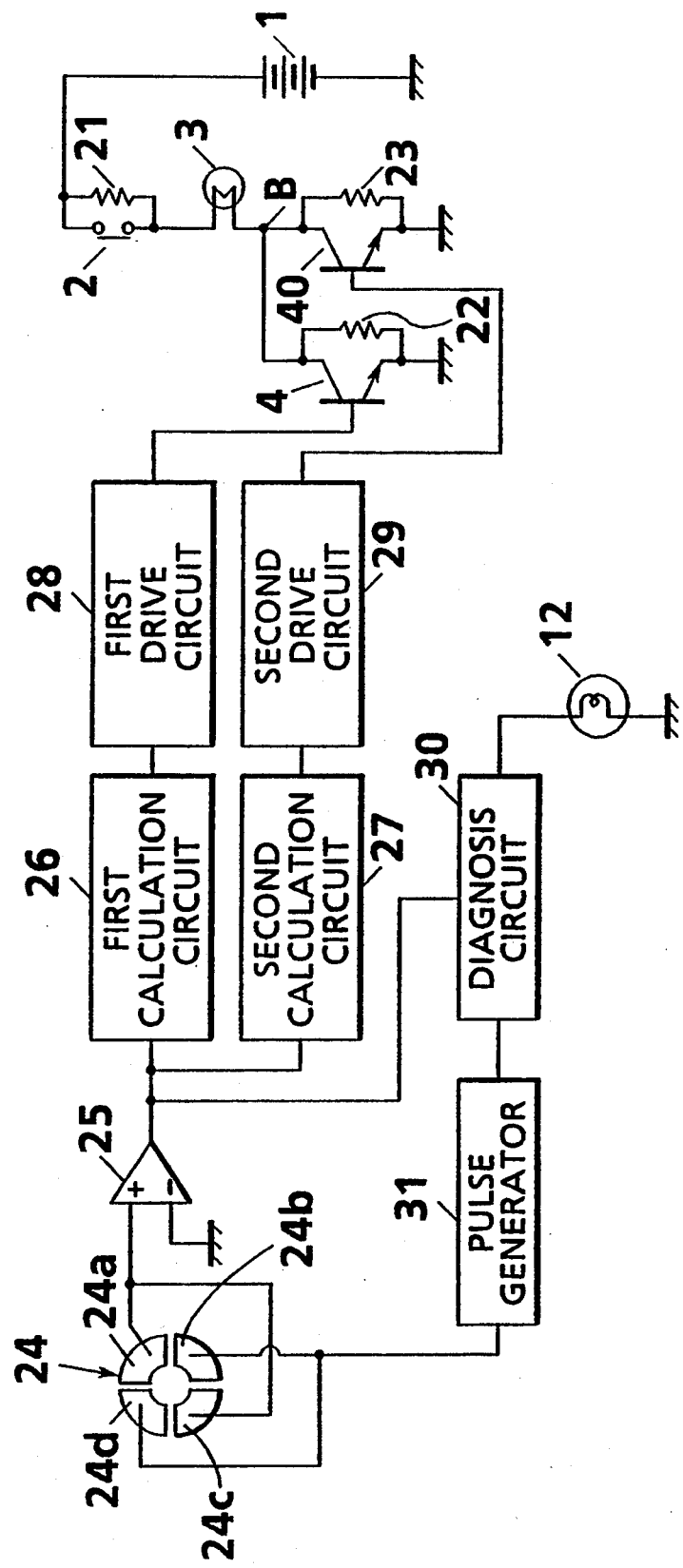
FIG. 6 shows a prior art air bag actuating apparatus.

It should be noted that the impact-simulating switch signal S2 has as large a magnitude as the impact signal S3 so that as high a simulation firing current as an actual firing current flows through the transistor 4 when the vehicle is actually collided. For example, the dummy firing current is about six amperes, which is as high as the actual firing current. When the dummy firing current flows through the dummy firing current path, the voltage at point A is on the order of 0.2–0.28 volts if the transistor 4 has the characteristic shown in FIG. 5. FIG. 5 shows the relationship between collector current $I_c$ and collector-emitter saturation voltage $V_{CE(sat)}$ at three different temperatures: $-55°$ C., $25°$ C. and $100°$ C. In the art, the critical temperature of (TC) of operation is normally viewed to be $-55°$ C.

It should be noted that transistors may have relatively small d-c current amplification factors at high currents due to variations, or may have defective bonding wires therewithin. Thus, even if the transistor 4 can be satisfactorily turned on at a small dummy current, it may not be properly turned on at an actual firing current.

Thus, it is advantageous to detect the voltage at point A with as high a dummy firing current as an actual firing current flowing through the transistor 4.

Operation

The operation of the first embodiment will now be described with reference to FIG. 1.

When the vehicle suffers an impact, the acceleration sensor 6 outputs a voltage proportional to the magnitude of deceleration of the vehicle due to the impact. The multiplexer 11 directs an impact signal S3, i.e., the output of the acceleration sensor 6 to the signal processing circuit 7.

The integrator 7a integrates the input thereto. The amplifier 7b amplifies the output of the integrator 7a. The comparator 7c compares the output of the amplifier 7b with the reference voltage 7d to output a firing signal if the output of amplifier 7b is greater than the reference voltage 7d.

When the signal processing circuit 7 outputs a firing signal to the buffer 8 after the collision of the vehicle, the buffer 8 supplies a base current to the transistor 4 to turn on the transistor 4. Meanwhile, the strong impact due to the collision causes the normally-opened impact switch 2 to close, allowing a firing current to flow through the switch 2, squib 3, and transistor 4 to actuate the air bag apparatus. The firing current is about six amperes when the battery voltage is 12 V and the squib 3 has a resistance of two ohms.

The diagnosis operation will now be described as follows: The diagnosis operation is usually carried out during, for example, several seconds after the ignition switch of the vehicle has been turned on.

Figure 2:
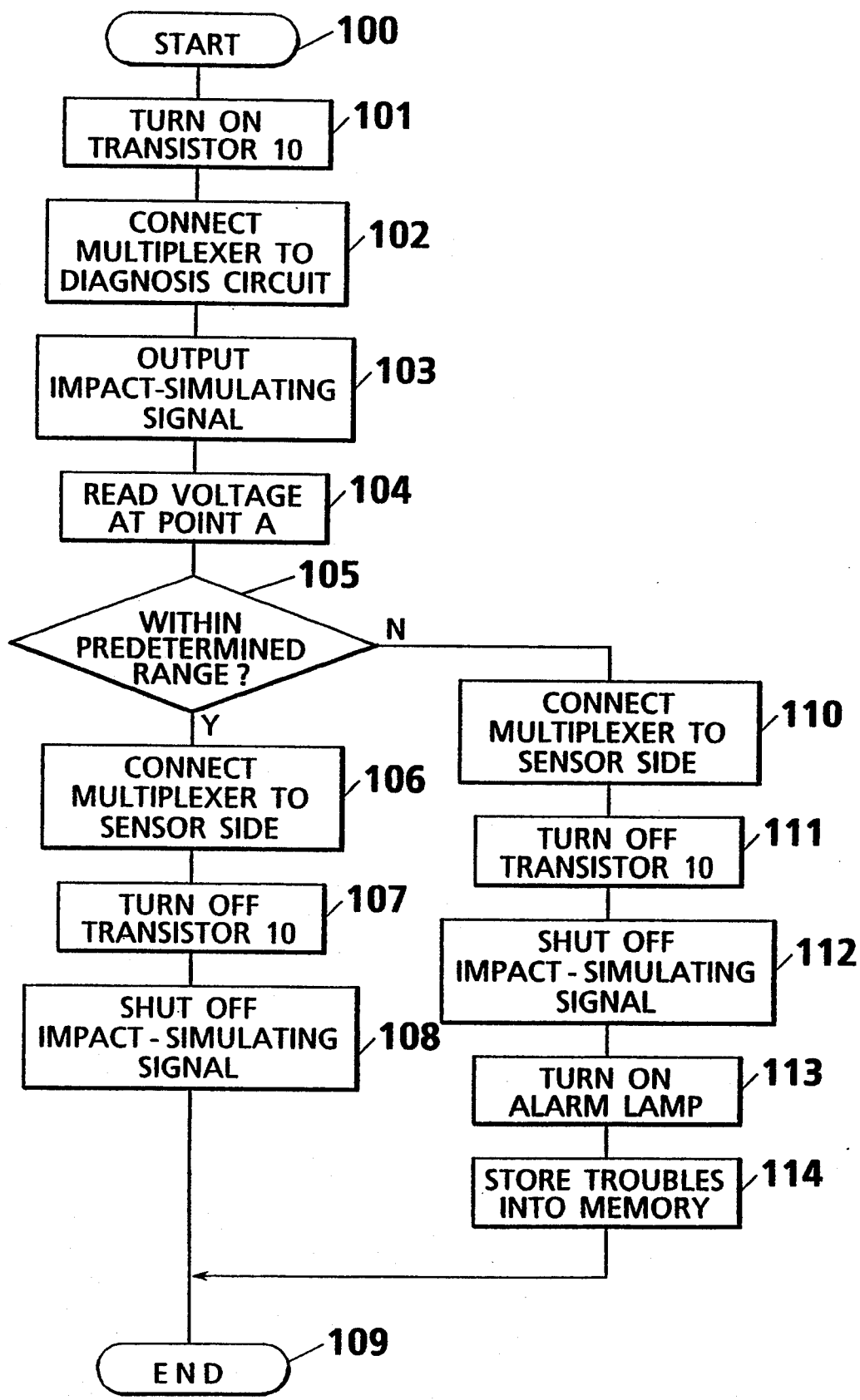
FIG. 2 is a flowchart of diagnosis operation.

FIG. 2 is a flowchart of diagnosis operation. The start of the operation is labeled 100. At step 101, the microcomputer 5a supplies a base current to the transistor 10 via a buffer 5b to turn on the transistor 10 in synchronism with the control signal S1. At step 102, the microcomputer 5a outputs the control signal S1 to the multiplexer 11, which control signal S1 causes the multiplexer 11 to switch to the side of the D/A converter 5f. The microcomputer 5a then outputs at step 103 an impact-simulating signal in the form of a digital signal to the D/A converter 5f which in turn outputs an analog signal corresponding to the impact-simulating signal. The impact-simulating signal is directed via the multiplexer 11 to the signal processing circuit 7. The signal processing circuit 7 outputs a firing signal via the buffer 8. The firing transistor 4 is turned on if the signal processing circuit 7, buffer 8, and firing transistor 4 are all normally operating, so that a dummy firing current path is formed through the battery 1, transistor 10, dummy load 9, firing transistor 4 through which a dummy firing current flows. At step 104, the microcomputer 5a receives the voltage at point A via the A/D converter 5e and compares it with a predetermined value.

Then, a check is made at step 105 to determine whether the voltage at point A is within the predetermined range. If any one of the multiplexer 11, signal processing circuit 7, buffer 8, and firing transistor 4 has some troubles, then the voltage at point A greatly deviates from the normal voltage. If the deviation is within a predetermined range, then the voltage at point A is assumed to be normal. If the voltage is within the predetermined range, then the program proceeds to step 106 where the microcomputer 5a causes the multiplexer 11 to switch to the side of acceleration sensor 6. At step 107, the microcomputer 5a shuts off the current to the base of transistor 10 to turn off the transistor 10. Thus, the dummy firing current path is opened. At step 108, the microcomputer 5a causes the D/A converter 5f to stop outputting the impact simulating signal, completing the diagnosis operation 109.

If the answer at step 105 is NO, the program proceeds to steps 110–112 where the same signal processing as steps 106–108 are carried out, so that the dummy firing path is opened and the impact simulating signal is stopped. At step 113, the microcomputer 5a causes the alarm lamp 12 to come on so as to warn the passenger of the occurrence of a trouble. At step 114, the microcomputer 5a causes the external memory 5g to store specific troubles, completing the diagnosis operation 109.

Second Embodiment

Figure 3:
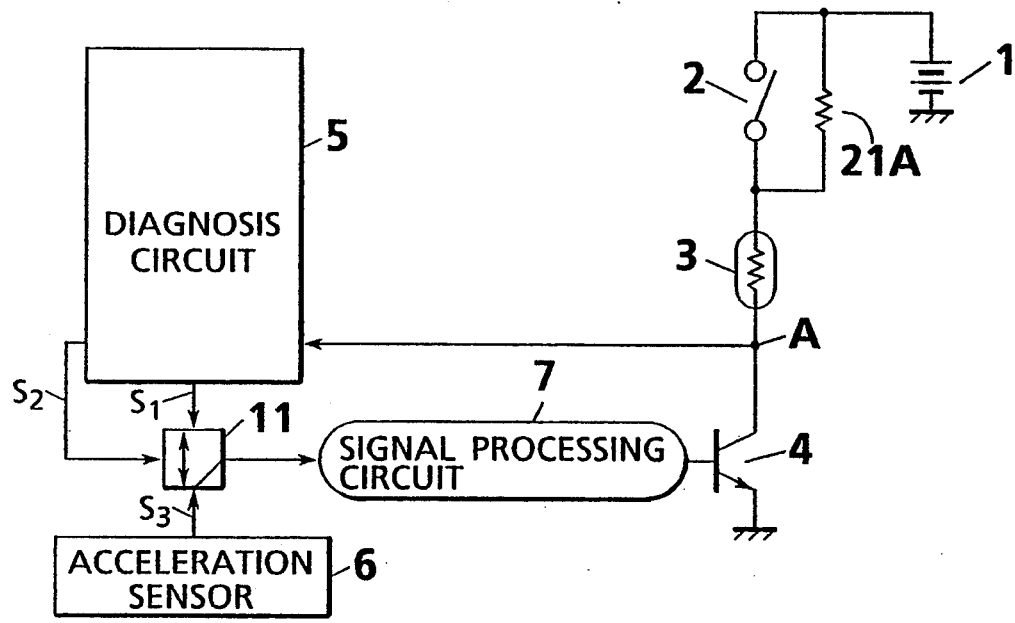
FIG. 3 shows a second embodiment of the invention.

FIG. 3 shows a second embodiment where the dummy load 9 and transistor 10 of the first embodiment are not used but a monitor resistor 21A is used in parallel with the impact switch 2. The operation of the second embodiment is the same as that of the first embodiment except for steps 101, 107, and 111. As shown in FIG. 3, the control signal S1 from the diagnosis circuit 5 drives the multiplexer 11 so as to selectively direct the impact signal S3 from the acceleration sensor 8 and the impact-simulating signal S2 from diagnosis circuit 5 to the signal processing circuit 7. The impact-simulating signal S2 has a substantially the same magnitude as the impact signal S3. The signal processing circuit 7 receives the impact-simulating signal S2 or impact signal S3 via the multiplexer 11, and then outputs the firing signal capable of driving the firing transistor 4. Detecting the voltage at point A when the microcomputer outputs the impact-simulating signal S2 allows the diagnosis operation to determine whether the signal path or circuit 7 is normally operating. In this embodiment, the current through the transistor 4 is much lower than the actual firing current but the signal path of impact signal and impact-simulating signal is diagnosed.

Third Embodiment

Figure 4:
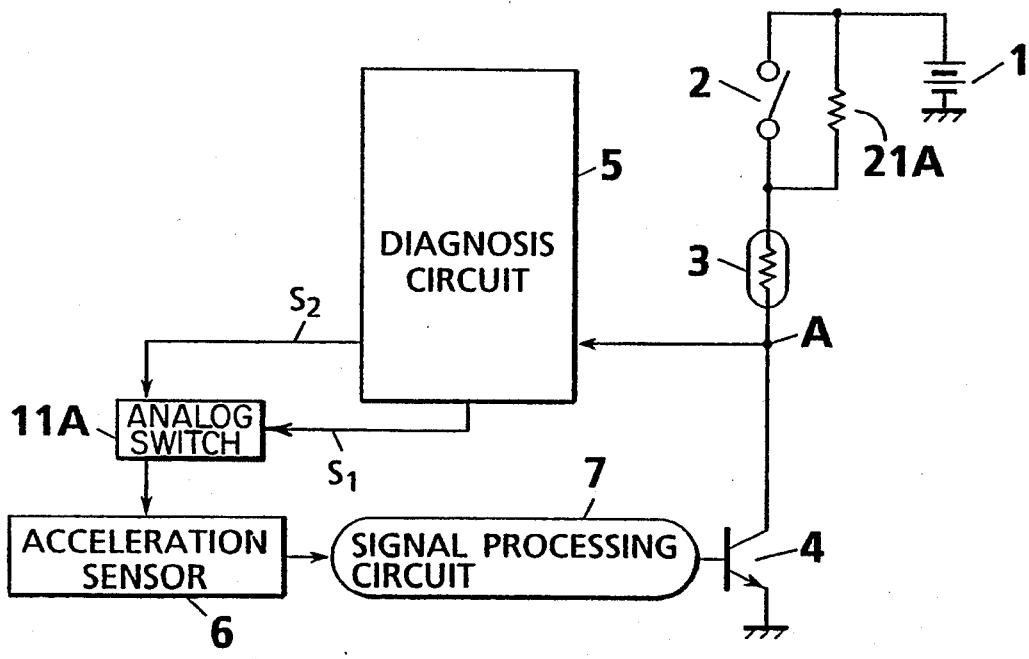
FIG. 4 shows a third embodiment.

FIG. 4 shows a third embodiment. The output of the acceleration sensor 8 is directly connected with the signal processing circuit 7. The impact-simulating signal S2 is directed to the signal processing circuit 7 through an analog switch 11A and the acceleration sensor 8 when the control signal S1 is outputted from the diagnosis circuit 5. Detecting the voltage at point A when the microcomputer 5a outputs the impact-simulating signal S2 allows the diagnosis operation to determine whether the signal path or circuit 7 are normally operating. The impact-simulating signal S2 has substantially the same magnitude as the impact signal S3.

In this embodiment, the current through the transistor 4 is much lower than the actual firing current but the signal path of impact signal and impact-simulating signal is diagnosed.

The aforementioned firing transistor 4 may take other forms such as SCR, mechanical relay, field effect transistor. While the embodiments have been described in terms of an air bag actuating apparatus, the invention may also be applied to other passenger protecting apparatuses such as seat belt pretensioner where the impact to the vehicle is detected.

What is claimed is:

1. A passenger protecting apparatus, comprising:
   a first circuit through which a first electric current flows, said first circuit including drive means for actuating a passenger-protecting element when an impact greater than a predetermined value is exerted on a vehicle;
   a second circuit connected in parallel to said first circuit through which a second electric current flows, said second circuit including a dummy load, and said second electric current being substantially equal to said first electric current;
   a firing switch means connected to a junction between said first circuit and said second circuit, said firing switch means being closed by a firing signal supplied thereto; and
   diagnosing means for diagnosing said firing switch, said diagnosing means causing said second electric current to flow through said firing switch and said second circuit such that said diagnosing means monitors a voltage across said firing switch to determine whether said firing switch is closed normally by said firing signal.

2. A passenger protecting apparatus according to claim 1, wherein said second circuit includes a second switch in series with said dummy load, said second switch being closed by a second signal supplied thereto to allow said second electric current through said second circuit; said diagnosing means supplies said second signal to said second switch and said firing signal to said firing switch to allow said second electric current to flow through said firing switch and said second circuit so as to determine whether said firing switch is closed normally by said firing signal, and said diagnosing means supplying said firing signal to said firing switch to allow said first electric current to flow through said firing switch and said first circuit when said impact is detected.

3. A passenger protecting apparatus according to claim 2, wherein said first circuit further includes at least one mechanical switch, said mechanical switch being closed to allow said first electric current to flow through said first circuit and said firing switch when an impact is greater than a predetermined value is exerted on the vehicle.

4. A passenger protecting apparatus according to claim 3, wherein said mechanical switch is in series with said drive means.

5. A passenger protecting apparatus according to claim 3, wherein said drive means is an electrical resistor having a first resistance for generating heat when said first electric current flows therethrough.

6. A passenger protecting apparatus according to claim 3, wherein said dummy load is an electrical resistor having a second resistance substantially equal to said first resistance.

7. A passenger protecting apparatus according to claim 3, wherein said first and second circuits are connected in parallel.

8. A passenger protecting apparatus according to claim 3, wherein said second switch and said firing switch are semiconductor switches.

9. A passenger protecting apparatus for use with a vehicle comprising:
   drive means, said drive means actuating a passenger-protecting element when a first current flows therethrough;
   at least one mechanical switch in series with said drive means and closed in response to an impact exerted on the vehicle;
   a firing switch in series with said drive means, said firing switch being closed by a firing signal supplied thereto;
   a monitor resistor in parallel with said mechanical switch;
   an acceleration sensor operably connected to said firing switch;
   diagnosing means for diagnosing said firing switch, said diagnosing means supplying a signal to said firing switch to allow a second current through said monitor resistor, drive means, and said firing switch when said impact is not detected such that said diagnosing means monitors a voltage across said firing switch to determine whether said firing switch is functioning normally; and
   switching means for selectively connecting either one of said acceleration sensor or said diagnosing means to said firing switch.

10. An actuating circuit, actuating a safety device upon determining an impact upon a vehicle, the actuating circuit comprising:
    a first series connection, including a heating element and an impact switch which closes upon sensing an impact;
    a second series connection, connected in parallel with said first series connection forming first and second nodes, the second series connection including a first electrical switch and a resistor;
    a second electrical switch connected to the first node formed by said first and second series connection;
    an acceleration sensor including an output operatively connected to an input of said second electrical switch;
    a diagnosis circuit, including a first output connected to a control input of the first electrical switch, controlling the opening and closing of the first electrical switch, a second output operatively connected to said input of said second electrical switch and an input of a signal from said first node, whereby the diagnosis circuit is able to close said first electrical switch and send a test signal to said second electrical switch in order to monitor at least one of said second series connection and said second electrical switch on the basis of said signal received from said first node.

11. The actuating circuit of claim 10, further comprising:
    a signal level determination circuit;
    wherein said acceleration sensor and said diagnosis circuit are operatively connected to said input of said second electrical switch through said signal level determination circuit.

12. The actuating circuit of claim 11 wherein the signal level determination circuit includes a comparator for comparing an input signal with a predetermined value, to thereby output a signal to close said second electrical switch only when a signal of a predetermined value or greater is input into said signal level determination circuit.

13. The actuation circuit of claim 12 wherein the signal level determination circuit includes an integrator and an amplifier connected in series with said comparator.

14. The actuating circuit of claim 11 further comprising:
    a multiplexer connected to said diagnosis circuit and said acceleration sensor;
    wherein said multiplexer, in response to a control input signal from said diagnosis circuit, selectively connects one of said second output of said diagnosis circuit and said output of said acceleration sensor, to an input of said signal level determination circuit.

15. The actuating circuit of claim 10, further comprising:
    an indicator; and wherein
    said diagnosis circuit includes a third output connected to said indicator.

16. The actuating circuit of claim 10, wherein said first and second electrical switches are transistors.

17. The actuating circuit of claim 10, wherein said test circuit includes a microcomputer and a memory.

18. The actuating circuit of claim 10, further comprising:
    a battery; and wherein
    said battery, said first series connection in parallel with said second series connection, and said second electrical switch are connected in a third series connection.

19. The actuating circuit of claim 18, wherein said battery is connected to said second node.

20. The actuating circuit of claim 10, wherein said heating element is a squib.

21. An actuating circuit, actuating a safety device upon determining an impact upon a vehicle, the actuating circuit comprising:
    an impact switch which closes in response to an impact;
    a resistor, connected in parallel to said impact switch forming a parallel connection;
    a heating element;

an electrical switch, wherein said parallel connection, said heating element and said electrical switch are connected in series, forming a series connection;

an acceleration sensor including an output operatively connected to an input of said electrical switch;

a diagnosis circuit, including a first output operatively connected to said input of said electrical switch and further including a first input of a signal from a node of said series connection, whereby the test circuit is able to send a test signal to said electrical switch and monitor at least said electrical switch on the basis of a signal received from said node; and a selector for selectively connecting either one of said acceleration sensor or said diagnosis circuit to said electrical switch.

22. The actuating circuit of claim 21, further comprising:

a signal level determination circuit;

wherein said acceleration sensor and said diagnosis circuit are operatively connected to said input of said electrical switch through a signal level determination circuit.

23. The actuating circuit of claim 22 wherein the signal level determination circuit includes a comparator for comparing an input signal with a predetermined value, to thereby output a signal to close said electrical switch only when a signal of a predetermined value or greater is input to said signal level determination circuit.

24. The actuation circuit of claim 23 wherein the signal level determination circuit includes an integrator and an amplifier connected in series with said comparator.

25. The actuating circuit of claim 22, said selector including:

a multiplexer connected to said diagnosis circuit and said acceleration sensor;

wherein said multiplexer, in response to a control input signal from said diagnosis circuit, selectively connects one of said first output of said diagnosis circuit and said output of said acceleration sensor, to an input of said signal level determination circuit.

26. The actuating circuit of claim 21, further comprising:

an indicator; and wherein said test circuit includes a third output connected to said indicator.

27. The actuating circuit of claim 21, wherein said electrical switch is a transistor.

28. The actuating circuit of claim 21, wherein said test circuit includes a microcomputer and a memory.

29. The actuating circuit of claim 21, wherein said series connection further includes a battery.

30. The actuating circuit of claim 29, wherein said battery is connected to said parallel connection and ground.

31. The actuating circuit of claim 21, wherein said heating element is a squib.

32. The actuating circuit of claim 31, wherein said resistor has a resistance such that said squib does not ignite upon closure of said electrical switch and opening of said impact switch.

* * * * *